United States Patent [19]

Feuerbaum et al.

[11] 4,220,853
[45] Sep. 2, 1980

[54] METHOD FOR THE CONTACTLESS MEASUREMENT OF THE POTENTIAL WAVEFORM IN AN ELECTRONIC COMPONENT AND ARRANGEMENT FOR IMPLEMENTING THE METHOD

[75] Inventors: Hans-Peter Feuerbaum; Eckhard Wolfgang, both of Munich, Fed. Rep. of Germany

[73] Assignee: Siemens Aktiengesellschaft, Munich, Fed. Rep. of Germany

[21] Appl. No.: 22,480

[22] Filed: Mar. 21, 1979

[30] Foreign Application Priority Data

Mar. 31, 1978 [DE] Fed. Rep. of Germany ....... 2814049

[51] Int. Cl.$^2$ ............................................. G01N 23/00
[52] U.S. Cl. ................................. 250/310; 324/158 D
[58] Field of Search ............... 250/306, 307, 310, 311, 250/399, 305; 324/158 D

[56] References Cited

U.S. PATENT DOCUMENTS

| | | | |
|---|---|---|---|
| 3,531,716 | 9/1970 | Tarui et al. | 250/310 |
| 3,549,999 | 12/1970 | Norton | 324/158 D |
| 3,764,898 | 10/1973 | Bohlen et al. | 250/310 |
| 3,956,698 | 5/1976 | Malmberg et al. | 234/158 D |

OTHER PUBLICATIONS

"Quantitative Voltage Contrast at High Frequencies in the SEM", Balk et al, *Scanning Electron Microscopy*, 1976, pp. 615-624.

*Primary Examiner*—Bruce C. Anderson
*Attorney, Agent, or Firm*—Kenyon & Kenyon

[57] ABSTRACT

A method for the contactless measurement of the potential waveform in an electronic component with a scanning electron microscope in which the electron beam is aimed at a measuring point of the integrated circuit until at least one phase range of the measuring voltage is determined by phase-shifting the pulses of the primary electron beam with respect to the measuring voltage and subsequently, the electron beam jumped to at least one further measuring point where a phase range is determined in the same manner permitting measurement of the potential waveform at different points of the integrated circuit and displayed together on a picture screen.

7 Claims, 8 Drawing Figures

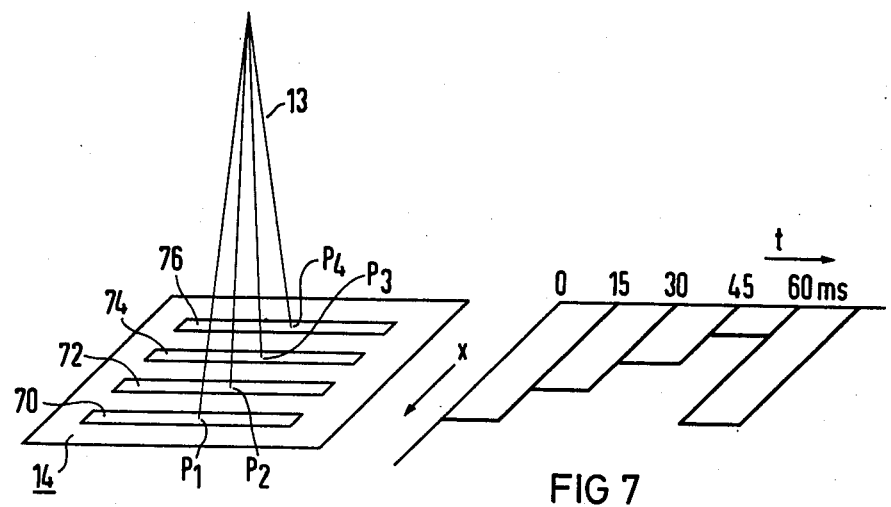
FIG 6
FIG 7
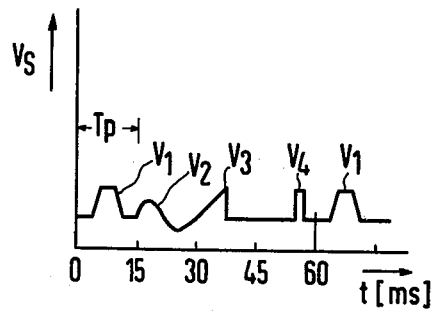
FIG 8

METHOD FOR THE CONTACTLESS MEASUREMENT OF THE POTENTIAL WAVEFORM IN AN ELECTRONIC COMPONENT AND ARRANGEMENT FOR IMPLEMENTING THE METHOD

BACKGROUND OF THE INVENTION

This invention relates to a method for the contactless measurement of the potential waveform in an electronic component, preferably an integrated circuit, with a keyed (or gated) electron beam which releases secondary electrons at the measuring point, the energy of which is determined by the potential at the measuring point.

As is known, the potential waveforms in conductors of an integrated circuit can be measured by means of a mechanical prod which is placed on the measuring point and the diameter of which cannot be much less than a few $\mu m$ for reasons of mechanical strength. Highly integrated circuits contain conductors, however, which are only a few $\mu m$ wide and at which measurements with the mechanical prod is relatively large, so that measurements on dynamic circuits can become falsified.

Potential contrast measurements on integrated circuits are therefore made with a scanning electron microscope, in which the mechanical measuring prod is replaced by an electron beam which can be focussed to a diameter of about 1 $\mu m$. At the measuring point, this primary electron beam releases secondary electrons from the metallic conductor, which electrons are accelerated in an electric field and the energy of which can be measured with a retarding-field spectrometer. A cylindrical deflection capacitor leads the secondary electrons through a decelerating field to the scintillator of an electron collector, which is followed by a control amplifier. The output voltage of the amplifier controls the grid voltage of the decelerating field. The amplifier keeps its output voltage relative to the voltage at the measuring point constant by means of a feedback loop. The grid voltage at the retarding-field electrode of the spectrometer is readjusted until the voltage between the grid and the measuring point has again reached its original constant value. Then the change of the grid voltage corresponds directly to the potential change at the measuring point of the sample.

It is not possible per se to measure the potential waveform of high frequency signals directly, as the amplifier cannot follow high frequency signals. Therefore, a strobscopic measurement in the manner of a sampling oscilloscope is used. There, the primary electron beam is keyed with the frequency of the signal to be measured and switched on each time during a very short time. This process is repeated often enough that a sufficient signal-to-noise ratio is obtained. Then, the phase of the electron pulse with respect to the measuring voltage is shifted in accordance with the so-called sampling principle and the process is repeated until at least one cycle of the measuring voltage is determined.

SUMMARY OF THE INVENTION

It is now an object of the present invention to describe a measuring method for the functional testing of electronic components, which, because of the fineness of the structures, is free of mechanical contact and, because of the high frequencies, is of low capacity, and can be connected to a computer controlled test system. Under these conditions, the measurement of different signals at several points of the sample is to be made and displayed on a picture screen sequentially in so short a time that the viewer has the impression of standing images with defined correlation in time.

According to the present invention, this problem is solved by the provision that the keyed primary electron beam is aimed at a measuring point of the electronic component long enough to obtain a phase range of the potential waveform of the measuring voltage by phase-shifting the pulses of the primary electron beam with respect to the measuring voltage. Subsequently, the electron beam jumps to at least one further measuring point, from which the measurement values of a phase range are collected by changing the phase of the primary electron beam relative to the measuring voltage. The electron beam, after the phase range is traversed, is led from one measuring point to another so fast that the measurement can repeat at the same measuring point, for instance, after 60 msec. This corresponds to a frame frequency of about 16 Hz. Then, an apparently standing image of the potential waveforms at the different measuring points is generated on the picture screen for the eye of the viewer.

The mechanical measuring prod is replaced by the contact-free electron beam, which is easy to position and focus and is of low capacity. The electron beam scanning head is placed on the sample, which is arranged in a vacuum system. As in a multi-channel oscillograph, the signals of the different measuring points of the component are displayed on a picture screen simultaneously.

In an arrangement for implementing the method of the present invention with a scanning electron microscope which is provided with a switching device for keying (gating) the primary electron beam as well as with a deflection device for positioning the electron beam, the switching device for shifting the phase of the primary electron pulses with respect to the potential waveform at the respective measuring point, is preferably provided with a control generator, the step voltages of which are each assigned to a phase of the pulses of the electron beam with respect to the potential waveform to be measured. The deflection device for the primary electron pulses is controlled so that, after the potential waveform is measured at the one measuring point, the electron beam jumps to the next measuring point and the waveform of the measuring signal is measured there in the same manner stroboscopically according to the sampling principle.

The gated primary electron beam generates at the measuring point secondary electrons which can leave the surface of the electronic component from a region about 5 nm thick near the surface into the vacuum and are drawn off by electrodes which are located above the component. The secondary electrons are accelerated by a voltage of, for instance, 300 V between the component and the suction electrode. Their energy is measured in a retarding field and corresponds to the potential at the measuring point. The potential waveform of the different measuring points is displayed on the picture screen according to the multi-channel principle.

BRIEF DESCRIPTION OF THE DRAWINGS

FIG. 6 shows the deflection of the electron beam to different measuring points of an integrated electronic component serving as the sample.

FIG. 7 shows the deflection of the electron beam as a function of time.

FIG. 8 shows the potentials at the different measuring points as a function of time.

DETAILED DESCRIPTION OF THE INVENTION

Figure 1:
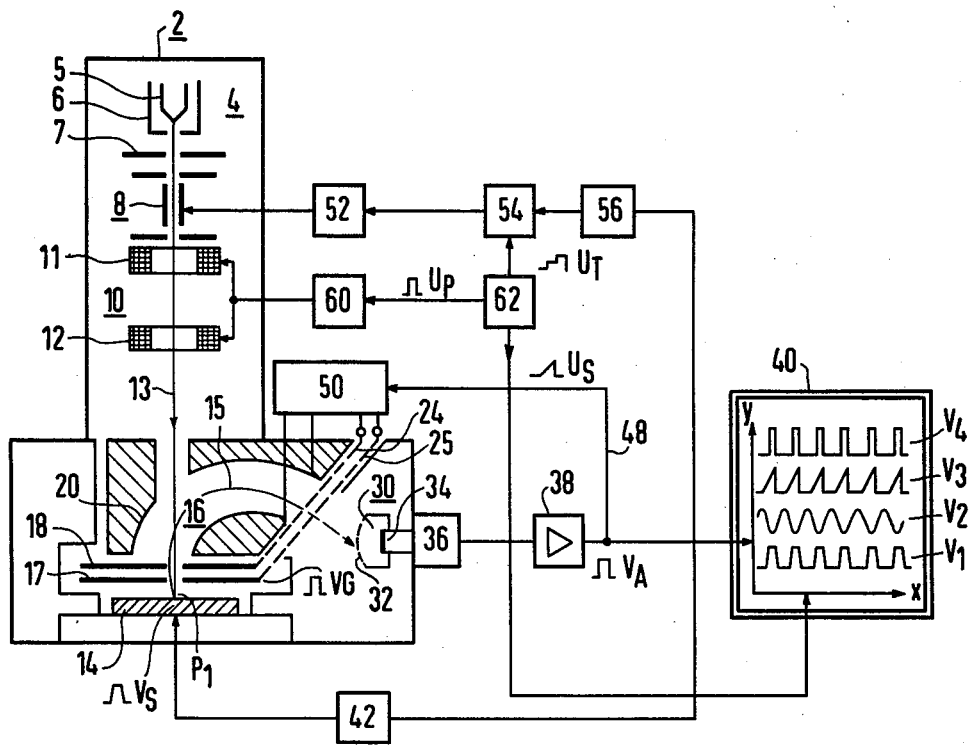
FIG. 1 is a block diagram an arrangement for implementing the method according to the present invention.

In FIG. 1, a scanning electron microscope contains an electron gun 4, a keying device 8 which is also called a chopper, as well as a beam deflection system 10. The electron gun 4 contains essentially a cathode 5 and a control electrode 6 as well as an anode 7. The electron beam deflecting device 10 contains, for instance, a coil system with deflecting coils 11 and 12, the magnetic field of which serves for positioning the primary electron beam 13 on a sample 14 which may preferably be an integrated circuit, at the conductors of which the potential waveform at different points is to be measured. The primary electron beam 13 releases secondary electrons 15, the energy of which serves as a measure for the potential at the measuring point.

Above the sample 14, a retarding-field spectrometer 16 is arranged which contains a control electrode 17 as well as an anode 18, which form an acceleration lens. A cylindrical deflection capacitor 20 is provided for deflecting the secondary electrons 15 which arrive, on their path indicated by an arrow, at an electron collector 30 via the retarding field of two electrodes 24 and 25. The electron collector 30 consists, for instance, of a collector screen 32 and a scintillator 34 with a not specifically designated light guide, and contains in general a post-acceleration section between the collector screen 32 and the scintillator 34 with an accelerating voltage of, for instance, 10 kV. The electron collector 30 is followed by a photo mulitiplier 36, which in general is coupled to a very sensitive preamplifier, as well as by a control amplifier 38. The output signal of this control amplifier 38 controls the voltage $V_G$ of the counterelectrode 25 by means of a control device 50 via a feedback loop 48 in such a manner that the potential difference between the counterelectrode 25 and the measuring point $P_1$ remains constant. Then the change of the voltage $V_G$ is equal to the change of the measuring voltage $V_S$ at the sample 14. The output signal of the control amplifier 38 represents a direct image of the potential waveform at the measuring point $P_1$. It is fed to a picture screen 40 and controls the deviation in the Y-direction, i.e., controls the amplitudes of the signals $V_1$ to $V_4$ which are displayed simultaneously from different measuring points of the sample 14 on the picture screen 40. The deviation in X-direction, i.e., the time axis, is determined by a sawtooth voltage $U_S$ of a control generator 62.

Control logic 42 supplies simultaneously the supply voltages, timing pulses and test patterns for the sample 14 and controls a rate generator 56, which serves as a pulse former for a time delay generator 54 which forms, together with a pulse generator 52, the control device for the keying device 8.

The delay generator 54 receives, in addition, from the control generator 62, a staircase voltage $U_T$, the step voltages of which set the phase of the pulses of the primary electron beam 13 via the keying device 8. The control generator 62 further controls, with an output signal $U_p$, the deflection system 10 for changing the measuring point via a raster generator 60.

Figure 2:
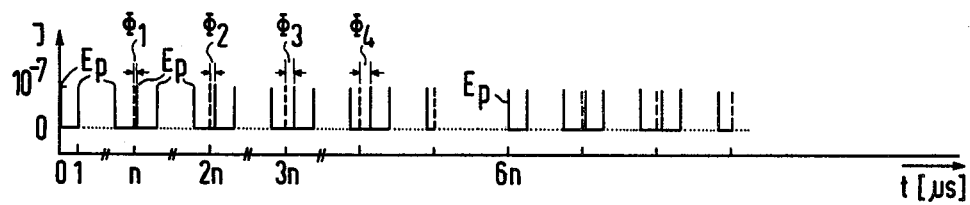
FIGS. 2 to 5 are diagrams illustrating the process steps of the present invention.

The change of the phase of the primary electron pulses $E_p$ can be seen from the diagram of FIG. 2, in which the primary electron current I is plotted as a function of the time t. It can be seen from the diagram of FIG. 3, in which the measuring voltages $V_1$ at the measuring point $P_1$ and the measuring voltage $V_2$ at a further measuring point $P_2$ are plotted as a function of the time t, that the measuring points of the first pulse packet always lie at the beginning of the rising flank of the cycle of the measuring voltage $V_1$. The frequency of the measuring voltage $V_s$ is assumed to be, for instance, 1 MHz. The phase is determined according to FIG. 4, in which the staircase voltgage $U_T$ of the staircase generator 62 is plotted as a function of the time t, by the height of the first step voltage $U_O$. This step voltage $U_O$ is set into the delay generator 54 during a phase step $T_p$ and does not change its phase, according to FIG. 2, during this time up to, say, n = 1000 pulses $E_p$. At the end of these n pulses $E_p$, the measurement value at this phase is determined.

Figure 5:
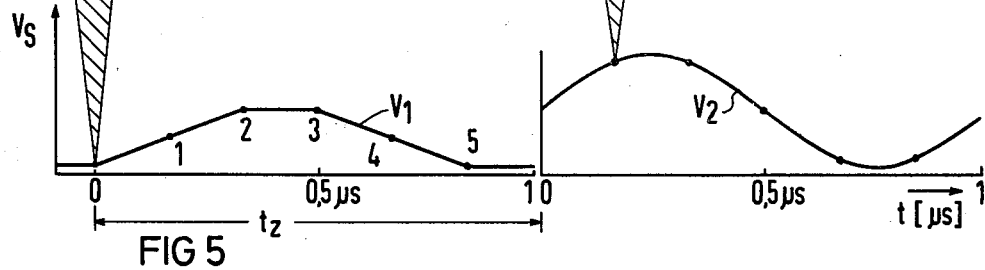

The display of a respective cycle of the measuring voltages $V_1$ and $V_2$ from the individual pulse sequences with different phase at the two measuring points $P_1$ and $P_2$ is shown in FIG. 5, in which the measuring voltage $V_s$ is plotted versus the time t. The measurement value determined from the first pulse sequence is designated in FIG. 5 with 0.

Figure 3:
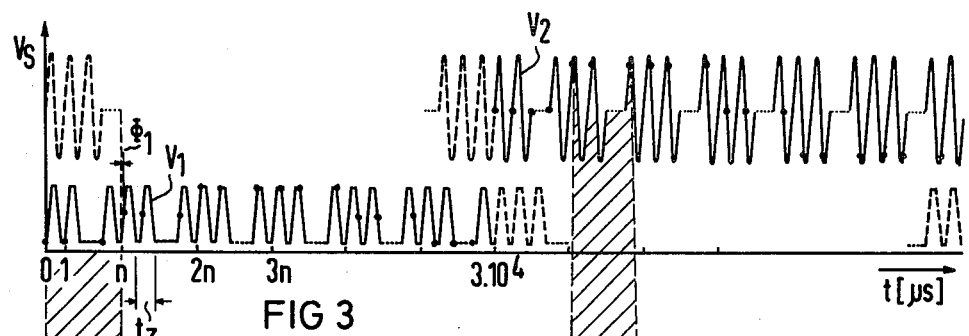

The step voltage $U_1$ shifts the phase $\phi_1$ of a further pulse sequence of n to 2n pulses $E_p$ and is relocated, for instance, according to FIG. 3, into the rising flank of the cycle of the measuring voltage $V_1$. Similarly, one obtains through the further step voltages $U_2$ to $U_5$ respective futher phase shifts, of which only the phases $\phi_2$ to $\phi_4$ are indicated in FIG. 2. With this phase shift over a cycle of the measuring voltage $V_s$ one obtains, according to FIG. 5, the respective potential at one of the measuring points 0 to 5. In a practical embodiment of an arrangement for implementing the method according to the present invention, the number of phases is generally chosen substantially larger and can be 100, for instance.

Figure 4:
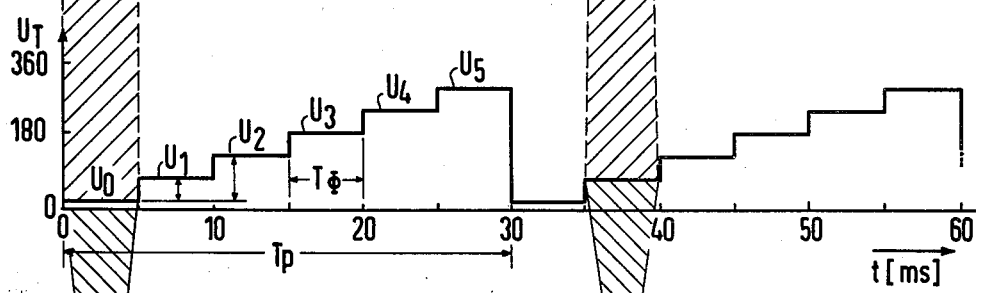

After 30 milliseconds, i.e., after the staircase voltage $U_T$ is traversed according to FIG. 4, an output signal $U_p$ is delivered by the control generator 62 to the raster generator 60 and the primary electron beam 13 is switched to the measuring point $P_2$. There, a cycle of the measuring voltage $V_2$ at the measuring point $P_2$, which is assumed to have, for instance, a sinusoidal waveform, is determined similarly by phase-shifting the measuring points according to FIG. 3 by means of the step voltages according to FIG. 4. After a total of 60 msec, the determination of the measurement values at the measuring point $P_2$ is completed and the primary electron beam can be switched to another measuring point.

In the diagram of FIGS. 2 to 5, a measurement at two measuring points is assumed for the sake of simplification. If the potential waveform is displayed, for instance, at 4 measuring points simultaneously, then the primary electron beam must be switched from one measuring point to the next each 15 msec, so that a measurement is made again at the same measuring point after 60 msec and flicker of the image for the eye of the viewer is avoided.

As is shown diagrammatically in FIG. 6, the primary electron beam 13 dwells at the measuring point $P_1$ of a conductor 70 of the sample 14. During this time, the process steps for determining the potential at this measuring point are executed, as explained in the diagrams of FIGS. 2 to 5, and thereby a cycle in the potential waveform $V_1$ in the conductor at the measuring point $P_1$ is determined. Subsequently, the primary electron beam 13 jumps to the second measuring point $P_2$ of a conductor 72 and the potential waveform at this measuring point $P_2$ is determined. The potential waveform at the further measuring points $P_3$ and $P_4$ of the conductors 74 and 76 is determined similarly. The time required by the electron beam 13 to get from one of the measuring points $P_1$ to $P_4$ to the next one is in the order of a few $\mu s$ and is negligibly small as compared to the dwelling time $T_p$ of 10 ms at each of the measuring points $P_1$ to $P_4$.

After each phase sweep $T_p$, the control generator 62 delivers its output signal $U_p$ to the raster generator 60, which may contain, for instance, a relay controlled scanning generator and switches the measuring points $P_1$ to $P_4$ by means of the deflection system 10. The primary electron beam 13 is switched from one measuring point to another in accordance with the diagram of FIG. 7, in which the displacement x is plotted versus the time t, always after 15 msec. During the dwelling time T, the respective potential pattern is determined by the process steps of FIGS. 2 to 5, as per the diagram of FIG. 8, in which the measuring voltage $V_s$ at the respective measuring point is plotted versus the time t. At the measuring point $P_1$, for instance, the high-frequency measuring voltage $V_1$ is to have trapezoidal shape. After 15 msec, the primary electron beam 13 is deflected in the x-direction as per FIG. 7 by appropriate control of the staircase generator to the measuring point $P_2$. At this measuring point $P_2$, the measuring voltage $V_2$ is to have, for instance, sinusoidal shape as per FIG. 8. Similarly, the primary electron beam 13 is deflected after 30 and 45 msec, respectively, to the measuring points $P_3$ and $P_4$ according to FIG. 7. At the measuring point $P_3$, the measuring voltage $V_3$ has the shape, for instance, of a sawtooth, and at the measuring point $P_4$, the measuring voltage $v_4$ appears as a narrow pulse. Subsequently, the primary electron beam 13 jumps back to the measuring point $P_1$ and a further measurement takes place.

After 60 msec, all measuring points $P_1$ to $P_4$ have been scanned by the primary electron beam 13, and then a further cycle of the potential waveform is measured again at the same measuring point. These potentials at the different measuring points can therefore be displayed on the picture screen 40 according to FIG. 1 separately in such a manner that the eye of the viewer sees standing images of the measuring voltages $V_1$ to $V_4$.

In the above example, one cycle $t_z$ of the two measuring voltages $V_1$ and $V_2$ was determined as the phase range. However, the phase range for the shift in time of the pulses $E_p$ of the primary electron beam 13 can also be chosen within a single cycle, for instance, if only the rising flank is to be measured. The phase range can also extend over several cycles, the spacing in time of the pulses $E_p$ being several cycles.

The control generator 62 can also be replaced by an electronic computer, which then takes over the control of th delay generator 54 and of the raster generator 60 as well as the x-deflection of the picture screen 40. In this embodiment of the measuring arrangement, the delay generator 54, the raster generator 60 and the picture screen 40 can then be controlled digitally.

The method according to the present invention for the contactless measurement of the potential waveform at different measuring points of an integrated electronic component in the manner of a multi-channel sampling oscilloscope with an electron beam scanning head can be used, for instance, in incoming inspection for integrated circuits as well as for the quality control thereof. Because the electron beam, which is focussed to a very small diameter, can be positioned easily and because of its low capacity, this device can also be used for testing highly integrated circuits with correspondingly narrow conductors.

The measuring method according to the present invention can also be used in measuring the potential waveform in ferroelectric and piezoelectric components. In addition, it is possible to measure the potential pattern in a ceramic barrier-layer capacitor.

What is claimed:

1. A method for the contactless measurement of the potential waveform resulting from application of a measuring voltage in an electronic component with a keyed primary electron beam which releases secondary electrons at the measuring point, the energy of which is determined by the potential at the measuring point, comprising:
    (a) aiming the keyed primary electron beam at a measuring point of the electronic component;
    (b) measuring the potential waveform of the measuring voltage over a phase range by phase-shifting the pulses of the primary electron beam with respect to the phase of the measuring voltage; and
    (c) subsequently, jumping the electron beam to at least one further measuring point and again measuring values of a phase range by changing the phase of the primary electron beam with respect to the measuring voltage.

2. The method according to claim 1, wherein the potential waveform of one measuring points is used as a reference signal in time for the potential waveform at the other measuring points.

3. The method according to claim 1, wherein the phase range for the phase shift in time of the primary electron beam is chosen within one cycle of the measuring voltage.

4. The method according to claim 1, wherein the phase range for the shift in time of the pulses of the primary electron beam extends over several cycles of the measuring voltage.

5. The method according to claim 4, wherein the spacing in time of the pulses of the primary electron beam amounts to several cycles of the measuring voltage.

6. Arrangement for carrying out the contactless measurement of the potential waveform in an electronic component with a keyed primary electron beam which releases secondary electrons at the measuring point, the energy of which is determined by the potential at the measuring point comprising:
    (a) a scanning electron microscope which is equipped with a keying device and a deflection system for the primary electron beam;
    (b) a spectrometer from measuring the energy of the secondary electrons;
    (c) means for deflecting the primary electron beam to position it to different measuring points;

(d) a control device for the keying device for adjusting the phase of the pulses of the primary electron beam with respect to the measuring voltage;

(e) a common control generator, generating step voltages which determine, during each step, a phase of the pulses of the primary electron beam with respect to the potential waveform of the measuring voltage at the different measuring points supplying outputs to said means for deflection for switching the measuring point to another position; and (f) a picture screen for displaying the measured waveforms as detected at said spectrometer.

7. An arrangement according to claim 6, wherein said keying device, said raster generator and said picture screen are adapted for digital control and wherein an electronic computer is provided as the control generator.

* * * * *